(12) United States Patent
Chen et al.

(10) Patent No.: US 6,256,262 B1
(45) Date of Patent: Jul. 3, 2001

(54) HIGH SPEED MEMORY DEVICE HAVING DIFFERENT READ AND WRITE CLOCK SIGNALS

(75) Inventors: Hsing-Yi Chen, Hsin-Chu Hsien; Jo-Yu Wang; Hsin-Kuang Chen, both of Taipei Hsien; Jyh-Ming Wang, Kaohsiung, all of (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 09/633,967

(22) Filed: Aug. 8, 2000

(51) Int. Cl.[7] ................................................. G11C 8/00
(52) U.S. Cl. ................................................. 365/233; 365/63
(58) Field of Search .............................. 365/233, 230.02, 365/230.03, 189.02, 189.05, 51, 52, 63

(56) References Cited

U.S. PATENT DOCUMENTS

| | | | |
|---|---|---|---|
| 5,896,340 | * | 4/1999 | Wong et al. ............... 365/230.03 |
| 5,901,100 | * | 5/1999 | Taylor ....................... 365/219 |
| 6,088,262 | * | 7/2000 | Nasu ......................... 365/185.04 |

* cited by examiner

Primary Examiner—Vu A. Le
Assistant Examiner—Anh Phung
(74) Attorney, Agent, or Firm—Townsend and Townsend and Crew LLP

(57) ABSTRACT

A memory device includes a global decoder circuit and two memory cell array devices, each of which is disposed adjacent to a respective one of opposing first and second sides of the global decoder circuit, and has global word lines coupled to the global decoder circuit. Each of two data input buffers is disposed at a third side of the global decoder circuit adjacent to a respective one of the memory cell arrays, and is coupled to the respective one of the memory cell arrays. A write control circuit is coupled to and is disposed adjacent to the third side of the global decoder circuit. A write clock buffer is disposed adjacent to the third side of the global decoder circuit, and is coupled to the data input buffers. A read control circuit is coupled to and is disposed adjacent to a fourth side of the global decoder circuit. Each of two multiplexer sets is coupled to bit lines of a respective one of the memory cell array devices. Each of two output circuits is coupled to a respective one of the multiplexer sets. A read clock buffer is disposed adjacent to the fourth side of the global decoder circuit, and is coupled to the output circuits.

12 Claims, 4 Drawing Sheets

HIGH SPEED MEMORY DEVICE HAVING DIFFERENT READ AND WRITE CLOCK SIGNALS

BACKGROUND OF THE INVENTION

1. Field of the Invention

The invention relates to a memory device, such as an SRAM, that has different read and write clock signals.

2. Description of the Related Art

Referring to FIG. 1, a conventional memory device is shown to comprise a global decoder circuit 11, two pairs of memory cell arrays 12 each of which is disposed adjacent to a respective one of opposing first and second sides of the global decoder circuit 11 and is coupled to the global decoder circuit 11, a write control circuit 13 coupled to and disposed adjacent to a third side of the global decoder circuit 11 between the first and second sides, a read control circuit 14 coupled to and disposed adjacent to a fourth side of the global decoder circuit 11 opposite to the third side, a pre-decoder circuit 15 coupled to the global decoder circuit 11 and the read control circuit 14 and disposed between the fourth side of the global decoder circuit 11 and the read control circuit 14, a read clock buffer 16 disposed on one side of the read control circuit 14 opposite to the pre-decoder circuit 15, a write clock buffer 17 disposed on one side of the read clock buffer 16 opposite to the read control circuit 14, and a pair of data input buffers 18, each of which is disposed at the third side of the global decoder circuit 11 adjacent to a respective one of the pairs of memory cell arrays 12, and is coupled to an external data input device (not shown), the respective one of the pairs of memory cell arrays 12 and the write clock buffer 17. The global decoder circuit 11 includes a write global decoder portion 111 and a read global decoder portion 112. Each memory cell array 12 includes a local decoder portion 121 between two mxn cell array portions 122. A multiplexer (MUX) 123 has an input side coupled to bit lines of the cell array portions 122 of the memory cell arrays 12. A sense amplifier (SA) 124 is coupled to an output side of the multiplexer 123. An output circuit (DO) 125 is coupled to an output end of the sense amplifier 124, and is further coupled to the read clock buffer 16.

A write operation for the aforesaid conventional memory device is conducted as follows: Input data to the memory cell arrays 12 are initially sent to the data input buffers 18. When write address sets corresponding to the input data are received by the write control circuit 13, the latter generates appropriate write address and write control signals that are provided to the write global decoder portion 111 of the global decoder circuit 11 to enable writing of the input data into the memory cell arrays 12. At this time, the write global decoder portion 111 and the local decoder portions 121 of the memory cell arrays 12 decode the write address sets so that appropriate ones of the memory cells of the cell array portions 122 are activated. Write clock signals from the write clock buffer 17 are received by the data input buffers 18 so as to control the transmission of the input data from the data input buffers 18 to the memory cell arrays 12. The input data are written into the activated ones of the memory cells of the cell array portions 122 at this stage.

A read operation for the aforesaid conventional memory device is conducted as follows: When read address sets are received by the read control circuit 14, the latter generates appropriate read address and read control signals to the global decoder circuit 11 to enable reading of the memory cell arrays 12. At this time, the pre-decoder circuit 15, the read global decoder portion 112 and the local decoder portions 121 of the memory cell arrays 12 decode the read address sets so that appropriate ones of the memory cells of the cell array portions 122 are activated. Data in the activated ones of the memory cells of the cell array portions 122 are received by the multiplexer 123. The output of the multiplexer 123 is sensed by the sense amplifier 124, and is provided to the output circuit 125. Read clock signals from the read clock buffer 16 are received by the output circuit 125 to control the transmission of output data to an external device (not shown).

Some of the drawbacks of the aforesaid conventional memory device are as follows:

1. Because the write clock buffer 17 and the data input buffers 18 are disposed on opposite sides of the global decoder circuit 11, the distance between the write clock buffer 17 and the data input buffers 18 is relatively long such that parasitic effect is not negligible and can affect adversely synchronized transmission of the input data to the memory cell arrays 12.

2. The signal strength at the bit lines of the cell array portions 122 is relatively weak, and is further weakened by coupling between the bit lines and the multiplexer 123, thereby leading to errors in the data sensed by the sense amplifier 124.

3. The memory cell arrays 12 are relatively large due to the presence of the local decoder portions 121. The large memory cell arrays 12 require relatively long global word lines for connection to the global decoder circuit 11. The relatively long global word lines are prone to errors due to parasitic effect.

SUMMARY OF THE INVENTION

Therefore, the object of the present invention is to provide a memory device of the aforesaid type that is capable of overcoming the above-mentioned drawbacks commonly associated with the prior art.

According to this invention, a memory device comprises a global decoder circuit, two memory cell array devices, two data input buffers, a write control circuit, write clock means, a read control circuit, two multiplexer sets, two output circuits, and read clock means.

The global decoder circuit has opposite first and second sides, and opposite third and fourth sides between the first and second sides.

Each of the memory cell array devices is disposed adjacent to a respective one of the first and second sides of the global decoder circuit, and has global word lines coupled to the global decoder circuit, and bit lines.

Each of the data input buffers is disposed at the third side of the global decoder circuit adjacent to a respective one of the memory cell arrays, is coupled to the respective one of the memory cell arrays, and is adapted to receive input data and to transmit the input data to the respective one of the memory cell arrays.

The write control circuit is coupled to and is disposed adjacent to the third side of the global decoder circuit. The write control circuit is adapted to receive write address sets corresponding to the input data and to generate appropriate write address and write control signals that are provided to the global decoder circuit upon receipt of the write address sets to enable writing of the input data into the memory cell array devices.

The write clock means, which is disposed adjacent to the third side of the global decoder circuit and which is coupled to the data input buffers, generates write clock signals that are provided to the data input buffers so as to control transmission of the input data from the data input buffers to the memory cell array devices.

The read control circuit is coupled to and is disposed adjacent to the fourth side of the global decoder circuit. The read control circuit is adapted to receive read address sets and to generate appropriate read address and read control signals that are provided to the global decoder circuit upon receipt of the read address sets to enable reading of the memory cell array devices.

Each of the multiplexer sets is coupled to the bit lines of a respective one of the memory cell array devices.

Each of the output circuits is coupled to a respective one of the multiplexer sets.

The read clock means, which is disposed adjacent to the fourth side of the global decoder circuit and which is coupled to the output circuits, generates read clock signals that are provided to the output circuits so as to control output of data by the output circuits.

The memory device further comprises two sense amplifier sets, each of which is disposed between and couples a respective one of the multiplexer sets to the bit lines of a respective one of the memory cell array devices.

In a preferred embodiment, each of the memory cell array devices includes a pair of memory cell arrays. Each of the memory cell arrays includes two cell array portions, and a local decoder portion between the cell array portions. The cell array portions have the bit lines, and local word lines coupled to the local decoder portion. The local decoder portion has the global word lines.

At least one component of the local decoder portion is disposed externally of an area allocated to the memory cell array, is disposed in a space between the memory cell array and the adjacent one of the data input buffers, and is coupled to the write control circuit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
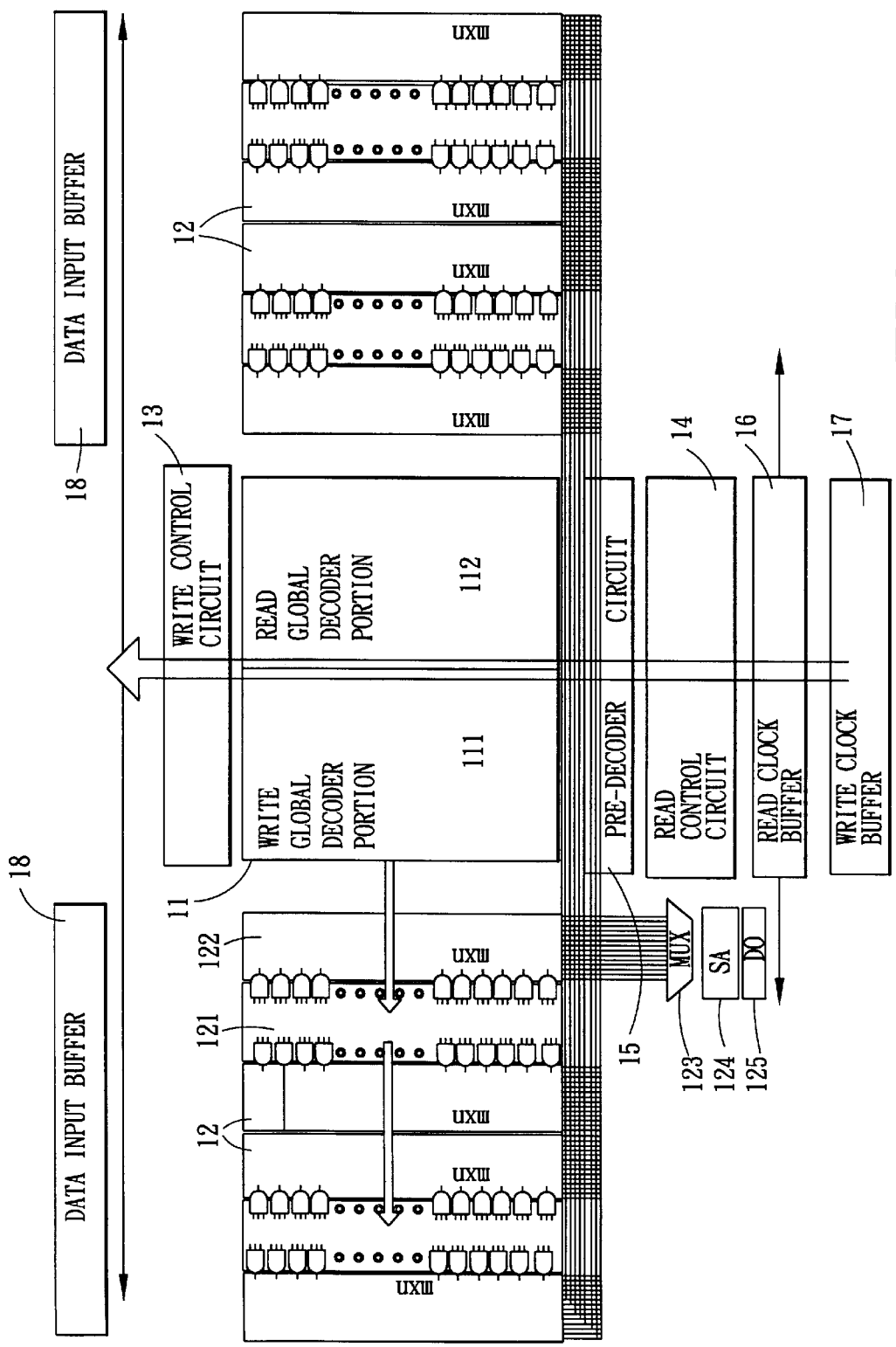
FIG. 1 is a schematic diagram showing a conventional memory device.

Before the present invention is described in greater detail, it should be noted that like elements are denoted by the same reference numerals throughout the disclosure.

Figure 2:
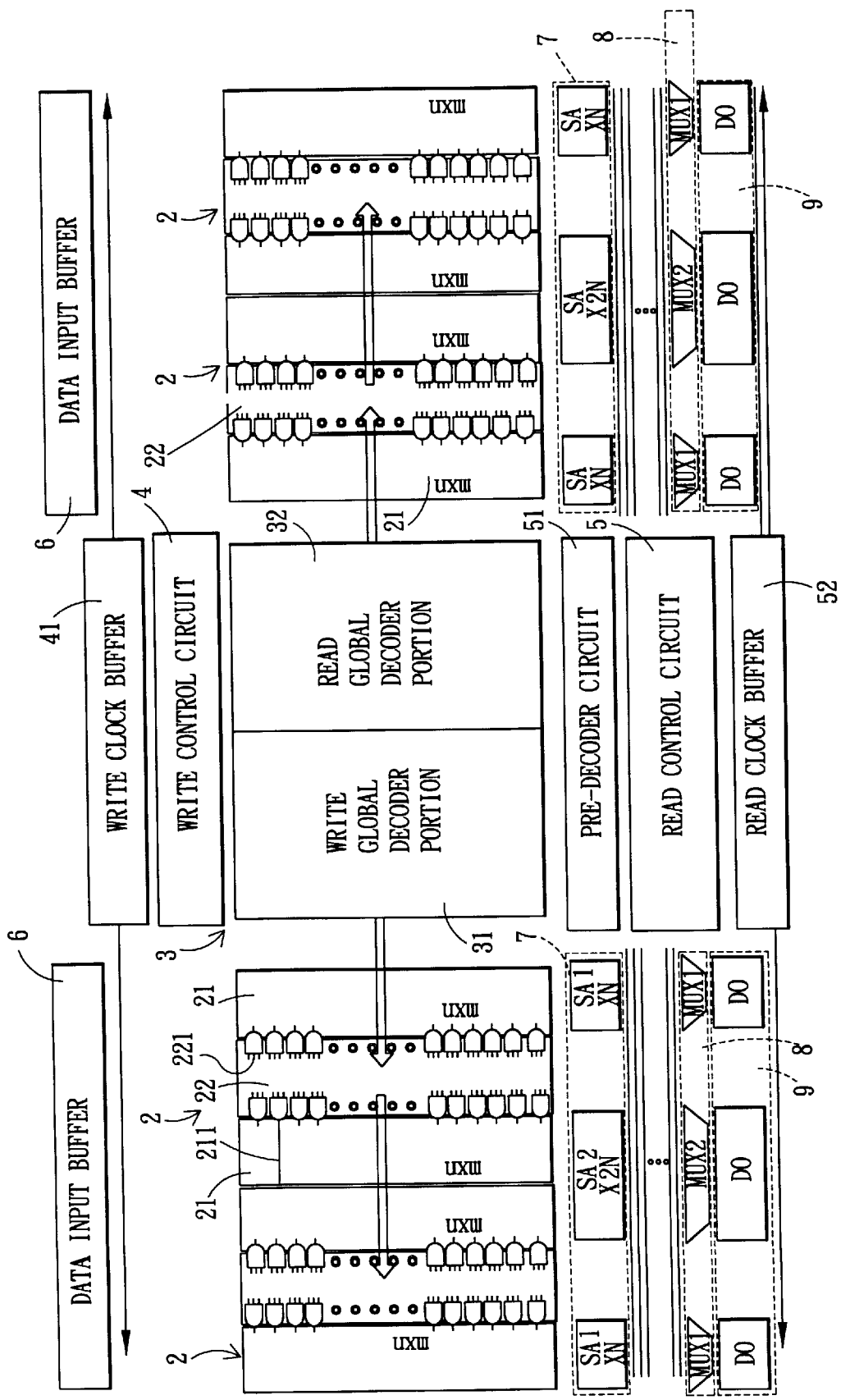
FIG. 2 is a schematic diagram showing a preferred embodiment of a memory device according to this invention.

Referring to FIG. 2, the preferred embodiment of a memory device according to the present invention is shown to be embodied in an SRAM having different read and write clock signals, a multiplexed output, a demultiplexed input, and an embedded architecture. The memory device comprises a global decoder circuit 3, two memory cell array devices each constituted by a pair of memory cell arrays 2, a write control circuit 4, a read control circuit 5, a pre-decoder circuit 51, a read clock buffer 52, a write clock buffer 41, a pair of data input buffers 6, two sense amplifier sets 7, two multiplexer sets 8, and two output circuits 9.

The global decoder circuit 3 includes a write global decoder portion 31 and a read global decoder portion 32.

Each of the two pairs of memory cell arrays 2 is disposed adjacent to a respective one of opposing first and second sides of the global decoder circuit 3. Each memory cell array 2 includes two mxn cell array portions 21, and a local decoder portion 22 between the cell array portions 21. The cell array portions 21 have bit lines (not shown), and local word lines 211 coupled to the local decoder portion 22. The local decoder portion 22 has global word lines 221 coupled to the global decoder circuit 3.

The write control circuit 4 is coupled to and is disposed adjacent to a third side of the global decoder circuit 3 between the first and second sides.

The read control circuit 5 is coupled to and is disposed adjacent to a fourth side of the global decoder circuit 3 opposite to the third side.

The pre-decoder circuit 51 is coupled to the read global decoder portion 32 of the global decoder circuit 3 and the read control circuit 5, and is disposed between the fourth side of the global decoder circuit 3 and the read control circuit 5.

The read clock buffer 52 is disposed adjacent to the fourth side of the global decoder circuit 3. Particularly, the read clock buffer 52 is disposed on one side of the read control circuit 5 opposite to the pre-decoder circuit 51.

The write clock buffer 41 is disposed adjacent to the third side of the global decoder circuit 3.

Clock signals from the read and write clock buffers 52, 41 preferably have different frequencies.

Each of the data input buffers 6 is coupled to an external data input device (not shown), is disposed at the third side of the global decoder circuit 3 adjacent to a respective one of the pairs of memory cell arrays 2, and is coupled to the write clock buffer 41.

Each of the sense amplifier sets 7 includes two first sense amplifier units (SA1) and a second sense amplifier unit (SA2). Each of the first sense amplifier units (SA1) is coupled to the bit lines of one of the cell array portions 21 of one of the memory cell arrays 2, said one of the cell array portions 21 of said one of the memory cell arrays 2 being remote to the other one of the memory cell arrays 2 in the corresponding pair of the memory cell arrays 2. The second sense amplifier unit (SA2) has a size twice that of the first sense amplifier unit (SA1), and is coupled to the bit lines of adjacent ones of the cell array portions 21 in the corresponding pair of the memory cell arrays 2.

Each of the multiplexer sets 8 includes two first multiplexer units (MUX1) and a second multiplexer unit (MUX2). Each of the first multiplexer units (MUX1) has an input side coupled to a respective one of the first sense amplifier units (SA1). The second multiplexer unit (MUX2) has an input side coupled to a respective one of the second sense amplifier units (SA2).

Each of the output circuits 9 includes three amplifiers (DO) coupled respectively to output sides of the first and second multiplexer units (MUX1, MUX2) of a corresponding one of the multiplexer sets 8, and is further coupled to the read clock buffer 52.

A write operation for the aforesaid conventional memory device is conducted as follows: Input data to the memory cell arrays 2 are initially sent by the external data input device (not shown) to the data input buffers 6, whereas write address sets corresponding to the input data are sent to the write control circuit 4. The write control circuit 4 responds by generating appropriate write address and write control signals that are provided to the write global decoder portion 31 of the global decoder circuit 3 to enable writing of the input data into the memory cell arrays 2. At this time, the write global decoder portion 31 and the local decoder portions 22 of the memory cell arrays 2 decode the write address sets so that appropriate ones of the memory cells of the cell array portions 21 are activated. Write clock signals from the write clock buffer 41 are received by the data input buffers 6 so as to control the transmission of the input data from the data input buffers 6 to the memory cell arrays 2. The input data are written into the activated ones of the memory cells of the cell array portions 21 at this stage.

Because the write clock buffer 41 and the data input buffers 6 are disposed on the same side of the global decoder circuit 3, the distance between the write clock buffer 41 and the data input buffers 6 is shorter as compared to that of the conventional memory device described beforehand such that the parasitic effect on synchronized transmission of the input data to the memory cell arrays 2 is minimal.

A read operation for the aforesaid conventional memory device is conducted as follows: When read address sets are received by the read control circuit 5 from an external data output device (not shown), the latter generates appropriate read address and read control signals to the global decoder circuit 3 to enable reading of the memory cell arrays 2. At this time, the pre-decoder circuit 51, the read global decoder portion 32 of the global decoder circuit 3, and the local decoder portions 22 of the memory cell arrays 2 decode the read address sets so that appropriate ones of the memory cells of the cell array portions 21 are activated. Data in the activated ones of the memory cells of the cell array portions 21 are amplified by the sense amplifier sets 7 to be within a full swing range of the latter. The amplified outputs of the sense amplifier sets 7 are received by the multiplexer sets 8, which provide appropriate ones of the amplified outputs to the output circuits 9. The output circuits 9 enhance the electrical current content of the signals from the multiplexer sets 8 to enhance the driving capability of the same when received by the external data output device (not shown). Read clock signals from the read clock buffer 52 are received by the output circuits 9 to control output of data by the latter.

Because the multiplexer sets 8 are coupled indirectly to the bit lines of the memory cell arrays 2 via the sense amplifier sets 7, output errors due to coupling between the bit lines and the multiplexer sets 8 can be minimized.

Figure 3:
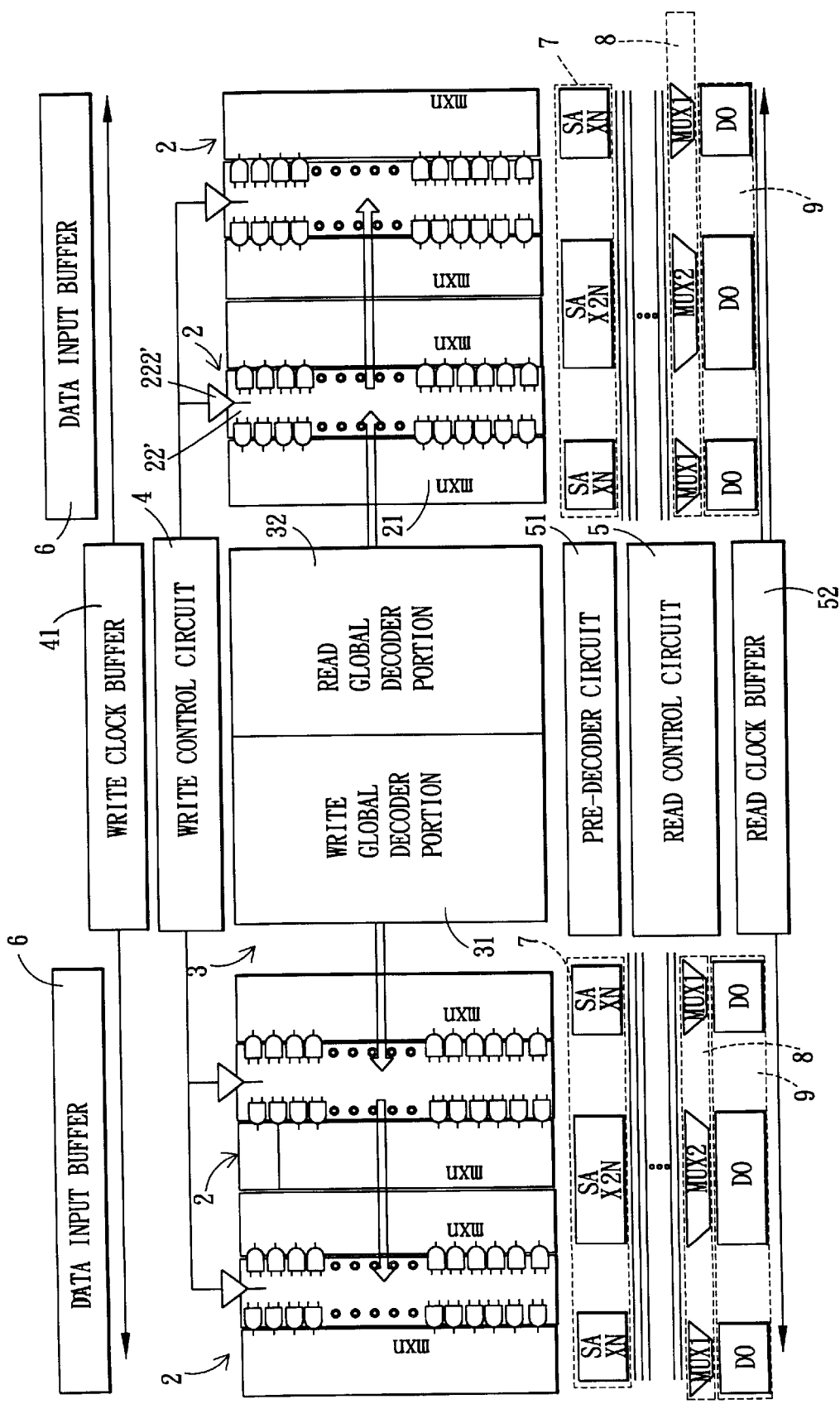
FIG. 3 is a schematic diagram showing another preferred embodiment of a memory device according to this invention.
Figure 5:
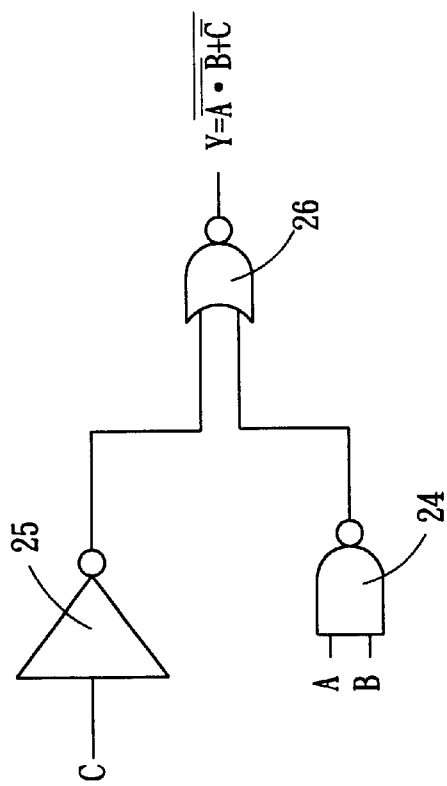
FIG. 5 is a circuit diagram illustrating some components of a local decoder portion of the embodiment of FIG. 3.
Figure 4:
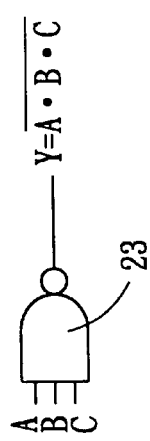
FIG. 4 is a circuit diagram illustrating a component of a local decoder portion of the embodiment of FIG. 2.

FIG. 3 illustrates another preferred embodiment of a memory device according to the present invention. The main difference between the embodiments of FIGS. 2 and 3 resides in the local decoder portions 22, 22' of the memory cell arrays 2. Unlike the local decoder portion 22 of the previous embodiment, the local decoder portion 22' has at least one component 222' that is disposed externally of an area allocated to the memory cell array 2. Particularly, the component 222' is disposed in a space between the memory cell array 2 and the adjacent data input buffer 6, and is coupled to the write control circuit 4. In the embodiment of FIG. 2, the local decoder portion 22 includes a three-input AND gate 23 (see FIG. 4). In the embodiment of FIG. 3, the three input AND gate is implemented using an equivalent logic circuit that includes a two-input NAND gate 24, an inverter 25 and a two-input NOR gate 26 (see FIG. 5). The component 222' can thus be the inverter 25. By disposing the component 222' externally of the area allocated to the memory cell array 2, the area occupied by the local decoder portion 22' in the memory cell array 2 can be reduced, thus resulting in shorter global word lines for connection to the global decoder circuit 3 that are less prone to errors due to the parasitic effect.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A memory device comprising:

a global decoder circuit having opposite first and second sides, and opposite third and fourth sides between said first and second sides;

two memory cell array devices, each of which is disposed adjacent to a respective one of said first and second sides of said global decoder circuit, and has global word lines coupled to said global decoder circuit, and bit lines;

two data input buffers, each of which is disposed at said third side of said global decoder circuit adjacent to a respective one of said memory cell arrays and is coupled to the respective one of said memory cell arrays, each of said data input buffers being adapted to receive input data and to transmit the input data to the respective one of said memory cell arrays;

a write control circuit coupled to and disposed adjacent to said third side of said global decoder circuit, said write control circuit being adapted to receive write address sets corresponding to the input data and to generate appropriate write address and write control signals that are provided to said global decoder circuit upon receipt of the write address sets to enable writing of the input data into said memory cell array devices;

write clock means, disposed adjacent to said third side of said global decoder circuit and coupled to said data input buffers, for generating write clock signals that are provided to said data input buffers so as to control transmission of the input data from said data input buffers to said memory cell array devices;

a read control circuit coupled to and disposed adjacent to said fourth side of said global decoder circuit, said read control circuit being adapted to receive read address sets and to generate appropriate read address and read control signals that are provided to said global decoder circuit upon receipt of the read address sets to enable reading of said memory cell array devices;

two multiplexer sets, each of which is coupled to said bit lines of a respective one of said memory cell array devices;

two output circuits, each of which is coupled to a respective one of said multiplexer sets; and read clock means, disposed adjacent to said fourth side of said global decoder circuit and coupled to said output circuits, for generating read clock signals that are provided to said output circuits so as to control output of data by said output circuits.

2. The memory device of claim 1, further comprising two sense amplifier sets, each of which is disposed between and couples a respective one of said multiplexer sets to said bit lines of a respective one of said memory cell array devices.

3. The memory device of claim 2, wherein each of said memory cell array devices includes a pair of memory cell arrays, each of said memory cell arrays including two cell array portions, and a local decoder portion between said cell array portions, said cell array portions having said bit lines, and local word lines coupled to said local decoder portion, said local decoder portion having said global word lines.

4. The memory device of claim 3, wherein each of said sense amplifier sets includes two first sense amplifier units and a second sense amplifier unit, each of said first sense amplifier units being coupled to said bit lines of one of said cell array portions of one of said memory cell arrays, wherein said one of said cell array portions of said one of said memory cell arrays is remote to the other one of said memory cell arrays in said memory cell array device, said second sense amplifier unit being coupled to said bit lines of adjacent ones of said cell array portions in said memory cell array device.

5. The memory device of claim 4, wherein each of said multiplexer sets includes two first multiplexer units and a second multiplexer unit, each of said first multiplexer units having an input side coupled to a respective one of said first sense amplifier units, said second multiplexer unit having an input side coupled to a respective one of said second sense amplifier units.

6. The memory device of claim 5, wherein each of said output circuits includes three amplifiers coupled respectively to output sides of said first and second multiplexer units of the corresponding one of said multiplexer sets.

7. The memory device of claim 1, wherein each of said memory cell array devices includes a pair of memory cell arrays, each of said memory cell arrays including two cell array portions, and a local decoder portion between said cell array portions, said cell array portions having said bit lines, and local word lines coupled to said local decoder portion, said local decoder portion having said global word lines.

8. The memory device of claim 7, wherein said local decoder portion has at least one component that is disposed externally of an area allocated to said memory cell array, that is disposed in a space between said memory cell array and the adjacent one of said data input buffers, and that is coupled to said write control circuit.

9. The memory device of claim 8, wherein said component is a logic circuit.

10. The memory device of claim 9, wherein said logic circuit is an inverter.

11. The memory device of claim 1, wherein said global decoder circuit includes a write global decoder portion and a read global decoder portion.

12. The memory device of claim 1, further comprising a pre-decoder circuit coupled to said global decoder circuit and said read control circuit, and disposed between said fourth side of said global decoder circuit and said read control circuit.

* * * * *